(12) United States Patent  
Moore et al.

(10) Patent No.: US 12,207,415 B2  
(45) Date of Patent: Jan. 21, 2025

(54) IDENTIFICATIONS OF DEVIATIONS RELATING TO ASSEMBLIES OF COMPONENTS

(71) Applicant: HEWLETT PACKARD ENTERPRISE DEVELOPMENT LP, Houston, TX (US)

(72) Inventors: David Allen Moore, Tomball, TX (US); Jonathon Hughes, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 442 days.

(21) Appl. No.: 17/456,813

(22) Filed: Nov. 29, 2021

(65) Prior Publication Data

US 2023/0171935 A1 Jun. 1, 2023

(51) Int. Cl.
*G06T 7/00* (2017.01)
*G06T 7/73* (2017.01)
*H05K 13/08* (2006.01)

(52) U.S. Cl.
CPC ......... *H05K 13/081* (2018.08); *G06T 7/0004* (2013.01); *G06T 7/001* (2013.01); *G06T 7/73* (2017.01); *H05K 13/083* (2018.08); *G06T 2207/30141* (2013.01)

(58) Field of Classification Search
CPC ............... G01N 21/956; G01N 23/223; G01R 31/2853; G01R 31/2894; G06F 21/44; G06F 21/73; G06N 20/00; G06N 3/043; G06N 3/08; G06T 2207/10116; G06T 2207/30148; G06T 7/0004; G06V 20/80; G06V 20/95; H01L 2223/54406; H01L 2223/54433; H01L 2223/54473; H01L 23/544; H01L 2924/00; H01L 2924/0002
See application file for complete search history.

(56) References Cited

U.S. PATENT DOCUMENTS

| 7,181,059 | B2* | 2/2007 | Duvdevani | G06V 10/94 |
| | | | | 382/199 |
| 10,802,942 | B2* | 10/2020 | Agerstam | G06F 11/3466 |
| 11,435,298 | B2* | 9/2022 | Moore | H05K 13/081 |
| 2005/0190959 | A1* | 9/2005 | Kohler | H05K 3/42 |
| | | | | 382/147 |

(Continued)

OTHER PUBLICATIONS

M Tanjidur Rahman et al, Physical Inspection & Attacks: New Frontier in Hardware Security, 2018, Retrieved Oct. 4, 2021, 10 Pgs.

*Primary Examiner* — Ian L Lemieux
(74) *Attorney, Agent, or Firm* — Trop, Pruner & Hu, P.C.

(57) ABSTRACT

In some examples, a system derives a first representation of an assembly of components based on a first source of information, and derives a second representation of the assembly of components based on a second source of information that is of a different type than the first source of information, where the second representation includes any or a combination of an indication of a source of a respective component of the assembly of components, or placement location information of a component in the assembly. The system compares the first representation to the second representation to identify a deviation between the first representation and the second representation, the deviation corresponding to an alteration of the assembly of components.

20 Claims, 4 Drawing Sheets

(56) References Cited

U.S. PATENT DOCUMENTS

| | | | |
|---|---|---|---|
| 2007/0047797 A1* | 3/2007 | Vilella | G06T 7/0004 |
| | | | 382/141 |
| 2010/0080445 A1* | 4/2010 | Polonsky | G06T 7/001 |
| | | | 382/147 |
| 2010/0128968 A1* | 5/2010 | Cherbis | G06V 10/147 |
| | | | 382/141 |
| 2011/0090333 A1* | 4/2011 | Haugan | H05K 13/0815 |
| | | | 348/136 |
| 2016/0169818 A1* | 6/2016 | Martin | G06V 20/80 |
| | | | 702/81 |
| 2017/0256466 A1* | 9/2017 | Bishop | H01L 21/78 |
| 2018/0096261 A1* | 4/2018 | Chu | G06N 20/20 |
| 2018/0101945 A1* | 4/2018 | Stone | G06V 20/95 |
| 2018/0300865 A1* | 10/2018 | Weiss | G05B 19/41875 |
| 2019/0228519 A1* | 7/2019 | Guo | G06T 7/001 |
| 2019/0304100 A1 | 10/2019 | Hever et al. | |
| 2020/0013156 A1* | 1/2020 | Weiss | G06V 10/771 |
| 2020/0273177 A1* | 8/2020 | Chen | G06V 20/653 |
| 2022/0164483 A1* | 5/2022 | Weiss | G06F 21/73 |
| 2022/0301134 A1* | 9/2022 | Stellari | G01N 21/956 |
| 2022/0394215 A1* | 12/2022 | Pipe-Mazo | G06T 7/77 |

\* cited by examiner

IDENTIFICATIONS OF DEVIATIONS RELATING TO ASSEMBLIES OF COMPONENTS

BACKGROUND

Products are made up of assemblies of components. Examples of products include electronic devices such as computers, storage devices, communication nodes, vehicles, household appliances, or other types of products, whether electronic or non-electronic.

BRIEF DESCRIPTION OF THE DRAWINGS

Some implementations of the present disclosure are described with respect to the following figures.

Figure 1:
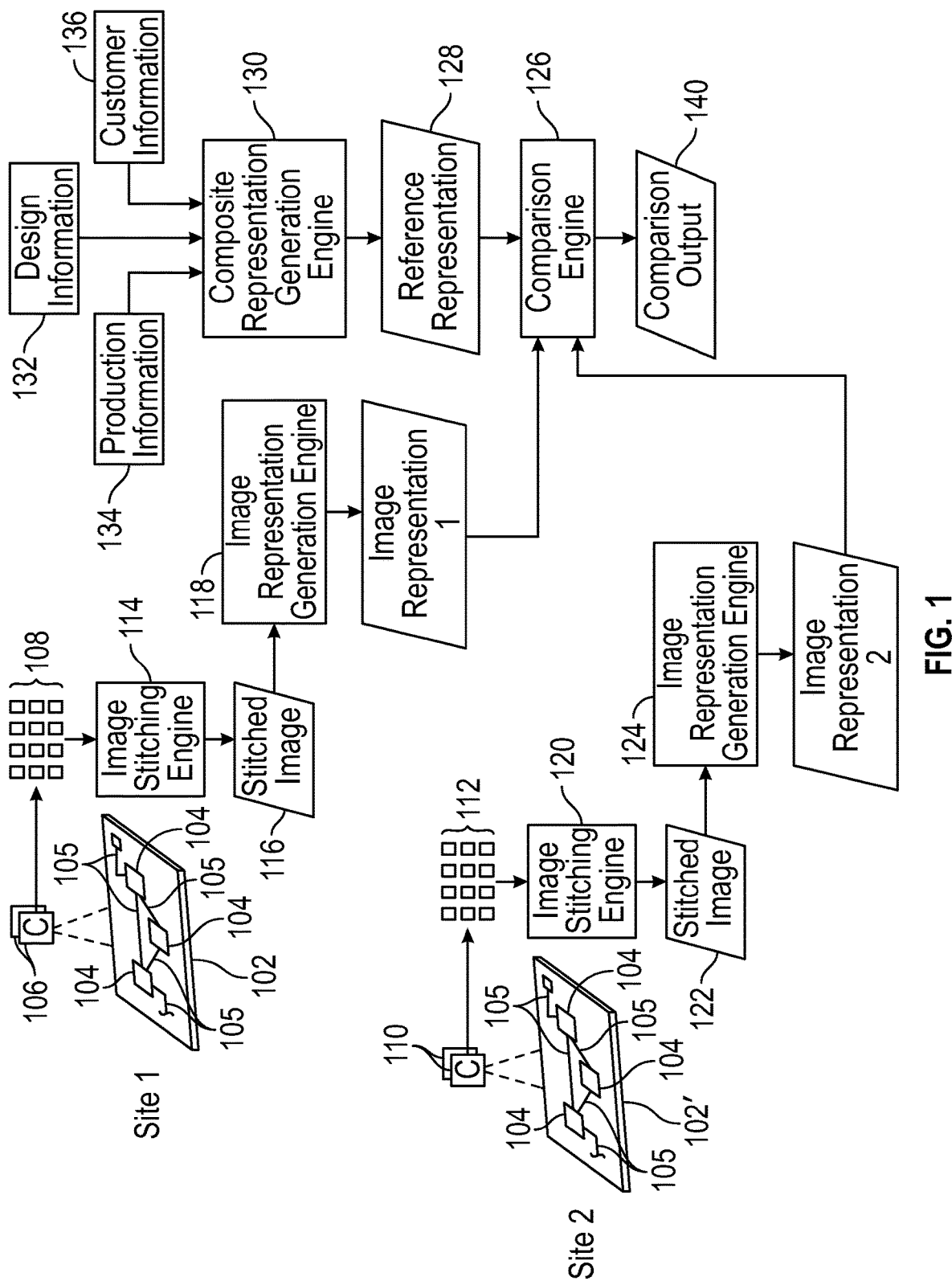
FIG. 1 is a block diagram of an example arrangement for comparing representations of an assembly of components to identify deviations, in accordance with some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

Supply chains for products may span large geographic regions. In some cases, products may be made in a first country and then shipped to a different second country, sometimes transiting through a third country (or multiple third countries), for transport to customers, retail outlets, distributors, and so forth.

During transport of a product, the product can spend a relatively long period of time outside of the direct control of a manufacturer or another entity that is responsible for the product. In some cases, the manufacturer or other entity may be a contractor for a seller of products, such that the seller may not have direct control over facilities of the contractor. As a result, there may be many opportunities for unauthorized personnel to tamper with the products. In some cases, even employees of the manufacturer or another entity may tamper with products. Additionally, returned products sent back to the manufacturer or another entity may have been tampered with.

Examples of tampering that can be performed with respect to a product can include physical tampering, such as substituting one component for another component, removing a component, adding a component, changing a placement location of a component, changing electrical conductors (e.g., electrically conductive traces on a circuit board, electrical wires, etc.), cutting electrical conductors, adding an electrical jumper, and so forth.

In electronic devices with circuit boards, tampering with an artwork associated with the circuit board can cause a circuit board to be built that deviates from its expected design. Other examples of tampering can include tampering with a bill of materials or any other document that identifies vendors or components, and so forth.

In accordance with some implementations of the present disclosure, different representations of an assembly of components are derived from respective different types of sources of information, where a representation can include any or a combination of an indication of a source of a component (e.g., vendor name, serial or other identification number, etc.) of the assembly of components, or placement location information of a packaged component (a component packaged in an encapsulant, for example) in the assembly. A vendor name can be a name of a company, an individual, or another source of the component. The serial number of a component can be a unique string of numbers that identify the component. More generally, identification information can include any string of characters or symbols that provides a unique identification of the component. Placement information can be in the form of geometric coordinates (e.g., in a two-dimensional (2D) space or in a three-dimensional (3D) space. If the assembly includes a circuit board, then the placement information can include geometric coordinates of where the component is placed on the circuit board. The different representations are compared to identify a deviation between the first representation and the second representation, where the deviation corresponds to an alteration of the assembly of components.

FIG. 1 is a block diagram of an example arrangement for producing representations of an assembly of components for comparison to identify a deviation in the assembly of components. A "deviation" in the assembly of components can refer to any aspect of the assembly of components that is different from a target aspect. An "aspect" of an assembly of components can refer to presence or absence of a component or group of components, a source or type of a component or a group of components, a placement location of a component or a group of components, a dimension, color, or another property of a component or a group of components, and so forth.

As examples of deviations, an unauthorized component may have been added to the assembly of components, an existing component may have been removed, an existing component may have been replaced with an unauthorized component, an electrical conductor may have been added, removed, or altered, and so forth. Any of the foregoing constitutes tampering that may allow an attacker to modify an operation of the assembly of components, gain access to information stored in the assembly of components, pass off a counterfeit product as a genuine product, and so forth.

FIG. 1 shows an example arrangement that can be used for detecting a deviation of an assembly of components. In examples according to FIG. 1, the assembly of components is in the form of a circuit board 102 on which are mounted various electronic components 104. Also, electrical conductors 105 may electrically connect the electronic components 104. For example, the electrical conductors 105 can be in the form of electrically conductive traces in the circuit board 102 and/or electrical wires. The electrical conductors 105 can connect the electronic components 104 to one another, or to other components.

Examples of the electronic components 104 can include any or some combination of the following: a processor, a memory device, a storage device, and input/output (I/O) device, and so forth. Also, other components may be present on the circuit board 102, including electrically conductive pads, passive components such as resistors, capacitors, inductors, and so forth.

In other examples, an assembly of components can be different from a circuit board, and can be part of electronic or non-electronic products.

A collection of cameras 106 at Site 1 can be used to capture images of the circuit board 102. A "collection of cameras" can refer to a single camera or multiple cameras. A "camera" can refer to any image sensor that can be used to capture an image of a target. An image sensor can capture an image in a visible color space or in a color space that is not visible to the human eye, such as an infrared image, an ultraviolet image, an X-ray image, and so forth. An image sensor can also include a depth sensor that is able to capture depth information of a target. In other examples, other types of image sensors can be used.

The collection of cameras 106 can capture a collection of image tiles 108, where each image tile 108 represents a different portion of the circuit board 102. Note that the collection of image tiles 108 can refer to a single image tile that represents the entirety (or almost the entirety) of a relevant portion of the circuit board 102, or multiple image tiles that represent different sections of the relevant portion of the circuit board 102. The "relevant portion" of the circuit board 102 is the portion where an unauthorized alteration may allow an attacker to modify an operation of the assembly of components, gain access to information stored in the assembly of components, pass off a counterfeit product as a genuine product, and so forth In examples according to FIG. 1, at Site 2, another collection of cameras 110 can be used to capture an image of a circuit board 102'. Note that Sites 1 and 2 can refer to different geographical sites or different parts of a particular facility. For example, Site 1 can refer to a manufacturing site where the circuit board 102 has been assembled. Site 2 can refer to a different site, such as a destination after transport of the circuit board 102 following the manufacture of the circuit board 102 at Site 1. The circuit board 102' at Site 2 may be identical to the circuit board 102, or may have been modified from the circuit board 102. The modification may be the result of tampering of the circuit board 102 at any of various different locations, e.g., at Site 1, Site 2, or any other location between Sites 1 and 2.

As another example, Site 1 can be a manufacturer site, a distributor site, or a retail site that provided a product including the circuit board 102 to a customer. Site 2 can be a return site where the customer has returned the product, such as for servicing or due to dissatisfaction with the product. Prior to return, the customer may have tampered with the product, which can be detected using techniques or mechanisms according to some examples.

Sites 1 and 2 can refer to other examples locations in other examples.

The collection of cameras 110 at Site 2 can similarly produce a collection of image tiles 112.

In other examples, there may be more sites at which a collection of cameras can be used to obtain images of assemblies of components, or a collection of cameras at just one site can be used to acquire images of assemblies of components.

An image stitching engine 114 receives the collection of image tiles 108 and produces a stitched image 116 that is based on combining the collection of image tiles 108 (by stitching the image tiles 108 of the collection).

As used here, an "engine" can refer to a hardware processing circuit, which can include any or some combination of a microprocessor, a core of a multi-core microprocessor, a microcontroller, a programmable integrated circuit, a programmable gate array, or another hardware processing circuit. Alternatively, an "engine" can refer to a combination of a hardware processing circuit and machine-readable instructions (software and/or firmware) executable on the hardware processing circuit.

The image stitching engine 114 can apply any of various different types of image stitching techniques that are able to stitch together multiple images based on identifying regions of overlap between different images to produce an aggregate image.

In examples where the collection of cameras 106 produces an image of the entirety of the relevant portion of the circuit board 102, then the image stitching engine 114 can be omitted.

The stitched image 116 is provided to an image representation generation engine 118, which produces image representation 1 based on the stitched image 116. In some examples, image representation 1 produced by the image representation generation engine 118 can be a representation that is in a format different from an image format. For example, image representation 1 can be in the form of a geometrical representation, a vector representation, or a voxel representation (voxels that represent points of elements in a three-dimensional (3D) space). In such examples, the image representation generation engine 118 converts the stitched image 116 to the different format of image representation 1.

A geometric representation can identify geometries of various components of the circuit board 102, including electronic components, electrical conductors, and other components. For example, outer profiles of the various components can be produced, e.g., rectangles can represent electronic components, lines can represent electrical conductors, and so forth.

A vector representation includes vectors that represent coordinates of different components on the circuit board 102. For example, each vector can indicate that a component has a particular shape (e.g., a triangle, a circle, a rectangle, a line, etc.) and the coordinate (e.g., an X-Y coordinate) of that component.

In other examples, the stitched image 116 can be provided as image representation 1 without any conversion by the image representation generation engine 118.

Similarly, the collection of image tiles 112 produced at Site 2 can be processed by an image stitching engine 120 to produce a stitched image 122. The stitched image 122 can be processed by an image representation generation engine 124 to produce image representation 2, which can have a format similar to that of image representation 1 (e.g., a geometrical representation, a vector representation, or an image).

In some examples, the image stitching engine 120 can be the same as or different from the image stitching engine 114, and the image representation generation engine 124 can be the same as or different from the image representation generation engine 118.

Note that in some examples, the image stitching engines 114, 120 and image representation generation engine 118, 124 can be provided at locations remote from Sites 1 and 2. For example, the engines 114, 120, 118, and 124 can be implemented using a collection of servers (a single server or multiple servers), such as web server(s), cloud server(s), and so forth.

In other examples, the image stitching engine 114 and/or the image representation generation engine 118 can be located at Site 1, and the image stitching engine 120 and/or image representation generation engine 124 can be located at Site 2.

A comparison engine 126 can compare various representations of an assembly of components (e.g., the circuit board 102 in FIG. 1) for the purpose of identifying whether a deviation has occurred in the circuit board 102. In some examples, the comparison engine 126 can compare image representation 1 and image representation 2. In examples where image representation 1 and image representation 2 are the stitched images 116 and 122, respectively, the comparison performed by the comparison engine 126 is of two images. The comparison engine at 126 attempts to find any differences between the images, for the purpose of detecting whether a deviation is present.

In further examples, the image representations 1 and 2 compared can be geometrical representations, vector representations, or other representations.

In some examples, instead of or in addition to comparing image representation 1 and image representation 2, the comparison engine 126 can compare an image representation (1 and/or 2) to a reference representation 128 produced by a composite representation generation engine 130. The composite representation generation engine 130 can receive information from various different sources, including design information 132, production information 134, and customer information 136.

The composite representation generation engine 130 can use any or some combination of the different sources of information (132, 134, and 138) to produce the reference representation 128 that is to be used by the comparison engine 126 to compare to image representation 1 and/or image representation 2.

The design information 132 can include various different types of design information, such as layout information that refers to a layout of various components on the circuit board 102, schematic information that defines a schematic arrangement of the components (e.g., a schematic diagram of the components and interconnections between the components, etc.), component placement information that identifies where different components are to be placed on the circuit board 102, drill information that identifies where through holes are drilled on the circuit board 102, a bill of materials that lists (e.g., reference designators, part numbers, manufacturer markings, etc.) the various components that are to be included on the circuit board 102, vendor information that identifies authorized vendors and/or unauthorized vendors of various components that are to be included on the circuit board 102, and so forth.

The production information 134 can include shop floor information that records lot numbers, date codes, parts markings of specific components, according to locations on the circuit board 102. The shop floor information can further include information of any authorized rework on the circuit board, where "rework" refers to a modification of the components of the circuit board that are authorized, such as to address bugs, errors, and so forth.

Additionally, the production information 134 can specify whether an optional section (or multiple optional sections) of the circuit board 102 is (are) populated. An optional section of the circuit board 102 is a section where population of components in the section depends upon a configuration of a product to be made. For example, a first customer may order a product having a first set of features, while a second customer can order a product having a different second set of features. To support the second set of features, an optional section of the circuit board 102 may be populated with components, whereas for the first set of features, the optional section does not have to be populated with components. This is an example of a build to order production approach.

The production information 134 can also include test information that includes results of tests performed on the circuit board 102. Tests can include operational tests, electrical tests, and/or any other type of tests.

The customer information 136 includes information relating to the product requested by a customer. For example, a customer may submit an order that lists various features desired by the customer, e.g., type of processor, how many processors, memory capacity, etc.

The composite representation generation engine 130 produces the reference representation 128 based on any or some combination of the foregoing sources of information. For example, the reference representation 128 can be a geometric representation or a vector representation, which can be compared to a geometric representation or vector representation in image representation 1 and/or image representation 2.

In some examples, the composite representation generation engine 130 can produce a geometric representation of the circuit board 102 using layout information, schematic information, and component placement information. The layout information, the schematic information, and the component placement information can be used to determine locations of where components of the circuit board 102 are to be placed, and the geometric profiles of the components. Additionally or alternatively, the production information 134 can be used by the composite representation generation engine 130 to produce a geometric representation of the circuit board 102. A bill of materials and/or vendor information in the design information 132 can be used to determine a source (e.g., a vendor name, a serial number or other identification information, etc.) of a component (or multiple components) on the circuit board 102. Also, shop floor information that records lot numbers, date codes, parts markings of specific components, according to locations on the circuit board 102, in the production information 134 can be used to determine a source of a component (or multiple components) on the circuit board 102. Additionally, the customer information 136 can be used by the composite representation generation engine 130 to determine a source of a component(s) on the circuit board 102. The reference representation 128 generated by the composite representation generation engine 130 can include information identifying the source of component(s) on the circuit board 102.

Once a geometric representation of the circuit board 102 is produced, a vector representation of the circuit board 102 can be readily generated based on the geometric representation. The vector representation includes vectors that correspond to geometries included in the geometric representation. In other examples, a voxel representation of the circuit board 102 can also be generated based on the geometric representation.

An image (e.g., 116 or 122) produced from the output of a collection of cameras (e.g., 106 or 110) can capture markings on components on the circuit board 102, where a marking can include an identification information of a component on the circuit board 102 and/or identification information of a vendor that built or supplied the component. These markings captured by a respective collection of cameras (106 or 110) are examples of information identifying source(s) of component(s) on the circuit board 102, and can be included in respective image representation 1 or 2. Optical character recognition (OCR) can be applied to the markings captured in images to derive text that identify a vendor or a component on the circuit board 102.

As discussed above, the reference representation 128 can also include information identifying sources of various components on the circuit board 102. When comparing image representation 1 and/or 2 to the reference representation 128, the comparison engine 126 can identify any deviations between source information of component(s) in image representation 1 and/or 2 and the reference representation 128.

In addition, image representation 1 and/or image representation 2 can include information regarding locations of various components on the circuit board 102. The reference representation 128 can also identify locations of different components, such as based on any or some combination of the design information 132 and the production information 134.

The comparison engine 126 can identify different types of deviations, and can include information identifying the deviations in a comparison output 140. For example, a location of a given component in the image representation (1 or 2) can differ from the location of the corresponding component in the reference representation 128, which can indicate that tampering has caused the component to be moved or modified. As another example, a marking in the image representation that identifies a source of component (s) can differ from corresponding source information of the component(s) in the reference representation 128. For example, the marking in the image representation for a given component on the circuit board 102 can identify a first vendor or can include a first identification information of the given component, while the reference representation 128 can identify a different second vendor or can include a different second identification information for the given component. This can be an indication that a replacement of the element from an authorized component to an unauthorized component has occurred.

Additionally, the reference representation 128 can include information pertaining to authorized and/or unauthorized vendors, such as based on the vendor information of the design information 132. The comparison engine 126 can use the information pertaining to authorized and/or unauthorized vendors to determine whether vendors identified in the image representation 1 and/or 2 are authorized or unauthorized vendors. If a component on the circuit board 102 is from an unauthorized vendor, then the comparison engine 126 can indicate that tampering has occurred.

As another example, the image representation (1 and/or 2) can indicate presence of a quantity of a certain component, such as a quantity of processors or a quantity of memory devices. This quantity indicated in the image representation can differ from a quantity indicated by the reference representation 128. For example, the layout information, schematic information, component placement information, bill of materials, shop floor information, and customer information may indicate that a first quantity of a component, whereas the image representation can indicate a different quantity of the component due to tampering. As another example, test information in the production information 134 can indicate that there are two processors present, whereas the image representation can indicate that there is only one processor or more than two processors present, which can indicate that a processor has been removed or added.

In other examples, instead of comparing an image representation to the reference representation 128, the reference representation 128 can be compared to another type of representation. For example, the composite representation generation engine 130 can produce the reference representation 128 based on the design information 132 and/or the production information 134. The composite representation generation engine 130 can produce a different representation based on another source of information, such as test information, etc. These two representations can be compared by the comparison engine 126 to detect whether a deviation has occurred. For example, the design information 132 can indicate a certain design of the circuit board 102, but the production information 134 can indicate that the circuit board 102 actually built differs from the target design.

In further examples, the comparison engine 126 can compare three or more representations derived from different sources of information, including, e.g., an image representation, a representation based on the design information 132, a representation based on the production information 134, and so forth.

Figure 2:
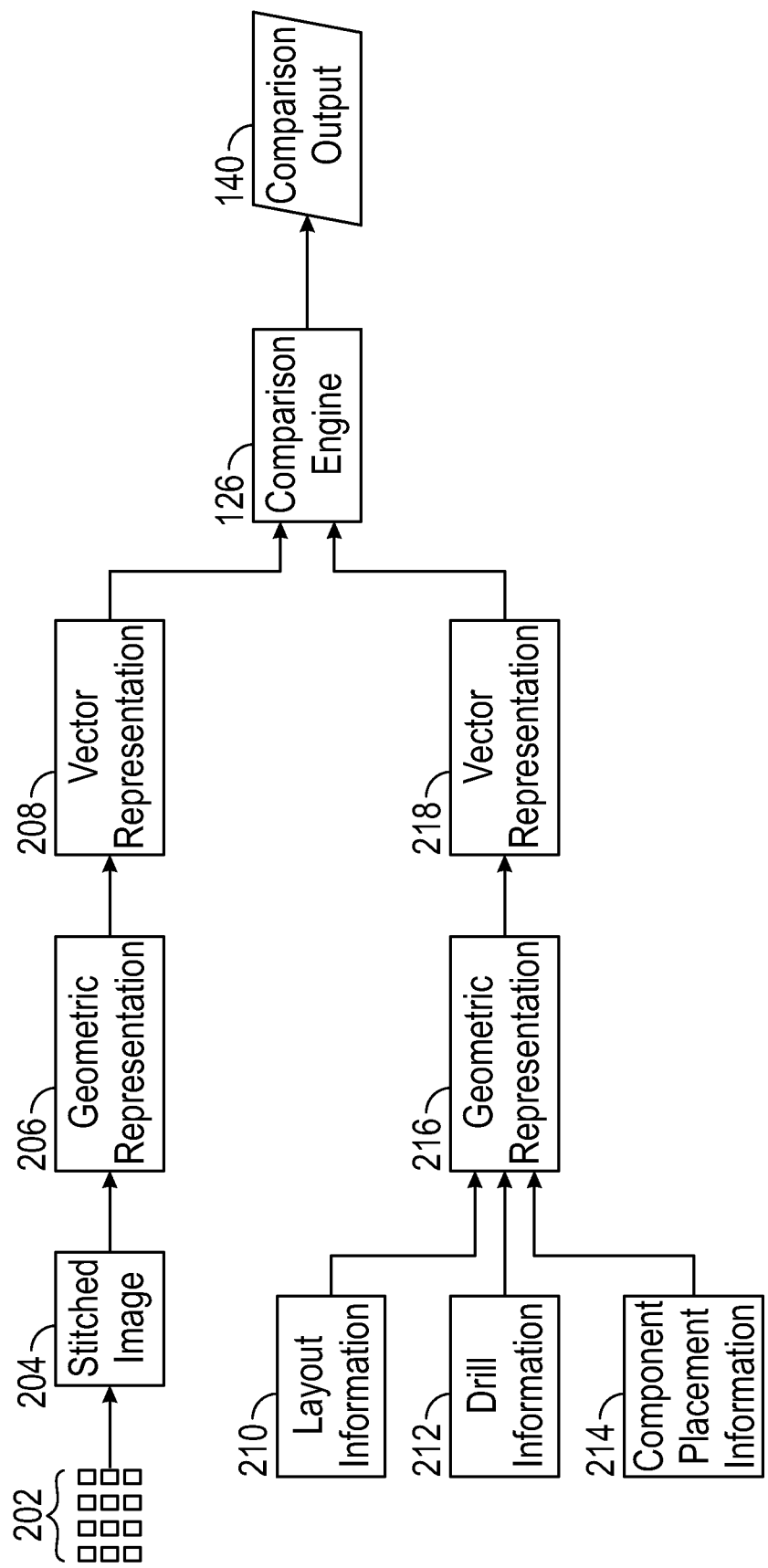
FIG. 2 is a block diagram to identify deviations based on comparing vector representations produced from different sources of information, according to some examples.

FIG. 2 is a block diagram of an example in which vector representations are created from two different types of source information and compared. A collection of image tiles 202 captured by a collection of cameras are stitched together to form a stitched image 204. Image analysis of the stitched image 204 is applied to identify the outer contours of each component (e.g., components on a circuit board depicted in the stitched image 204). The image analysis can produce geometric shapes to represent the identified outer contours of the components. A geometric representation 206 of the circuit board is produced from the identified geometric shapes (e.g., rectangles, circles, lines, etc.) that represent respective components on the circuit board. Once the geometric representation 206 is created, then vectorization can be applied to describe the geometric shapes (e.g., rectangles, circles, lines, etc.) in a vector representation 208. Also, the positions of each geometric shape can be identified, and geometric coordinates representing these positions can be added to the vector representation 208. For example, the vector representation 208 can include a list of vectors, where each vector can specify a geometric shape (e.g., a rectangle, a circle, a line, etc.) representing a component, and geometric information of the geometric shape. For a rectangle, the geometric information can specify the coordinates of the four corners of the rectangle. For a circle, the geometric information can specify the coordinates of the center of the circle, and a radius of the circle. For a line, the geometric information can specify the coordinates of the two endpoints of the line.

The vector representation 208 is a first vector representation. Another vector representation can be created from different sources of information, including layout information 210, drill information 212, and component placement information 214, for example. The layout information 210 specifies a layout of various components on the circuit board. For example, the layout information 210 can include a digital representation that defines the geometric structures of different components on the circuit board. The drill information 212 identifies where through holes are drilled on the circuit board. The component placement information 214 identifies where different components are to be placed.

Any or some combination of the foregoing information (or other information in other examples) can be used to produce a geometric representation 216 of the circuit board. Since the layout information 210, drill information 212, and component placement information 214 include information indicating geometric structures and locations of components, the geometric representation 216 can be readily created. Vectorization can then be applied on the geometric representation 216 to produce a vector representation 218, which can be compared to the vector representation 208 by the comparison engine 126 to identify a deviation between the vector representations 208 and 218, where the deviation corresponds to an alteration of the circuit board.

Figure 3:
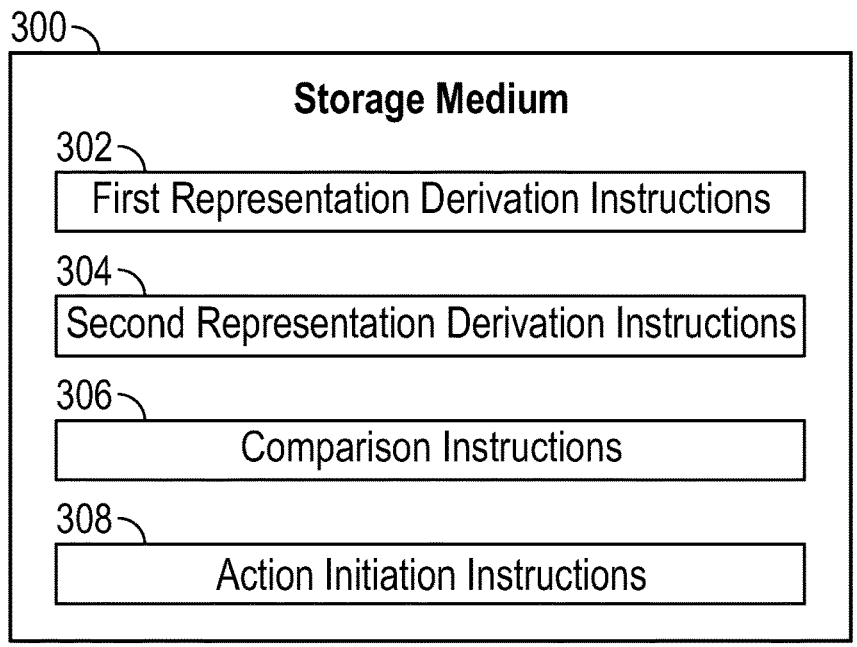
FIG. 3 is a block diagram of a storage medium storing machine-readable instructions according to some examples.

FIG. 3 is a block diagram of a non-transitory machine-readable or computer-readable storage medium 300 according to some examples. The storage medium 300 stores machine-readable instructions that upon execution cause a system (e.g., a computer or multiple computers) to perform various tasks.

The machine-readable instructions include first representation derivation instructions 302 to derive a first representation of an assembly of components based on a first source of information. The first representation can include an image representation (e.g., image representation 1 or 2 in FIG. 1) or can be a representation produced by the composite representation generation engine 130 based on any of information 132, 134, and 136.

The machine-readable instructions include second representation derivation instructions 304 to derive a second representation of the assembly of components based on a second source of information that is of a different type than the first source of information. Note that the first representation and the second representation can be of the same format, or may have different formats. The second representation includes any or a combination of an indication of a source of a respective component (e.g., identification information of a vendor or a component) of the assembly of components, or location information of a component in the assembly.

The machine-readable instructions include comparison instructions 306 to compare the first representation to the second representation to identify a deviation between the first representation and the second representation, where the deviation corresponds to an alteration of the assembly of components.

The machine-readable instructions include action initiation instructions 308 to initiate an action to address the identified deviation. For example, the action can include notifying an administrator or other party, triggering a review, disabling an operation of the assembly of components, stopping any further assembly, and so forth.

In some examples, the second source of information (e.g., a bill of materials, vendor information, shop floor information, lot numbers, date codes, parts markings, etc.) includes any or a combination of an identifier of a vendor of a component or an identifier relating to a component (e.g., serial number or another component identification information).

In some examples, the second source of information (e.g., component placement information, drill information, lot numbers, date codes, parts markings, etc.) identifies locations of the components in the assembly.

In some examples, the first representation corresponds to a first stage (e.g., design stage) of building the assembly of components, and the second representation corresponds to a different second stage (e.g., production stage) of building the assembly of components.

In some examples, the machine-readable instructions can derive a third representation of the assembly of components based on test data relating to testing of the assembly of components, and compare the first representation to the third representation to identify a deviation between the first representation and the third representation, the deviation between the first representation and the third representation corresponding to an alteration of the assembly of components.

Figure 4:
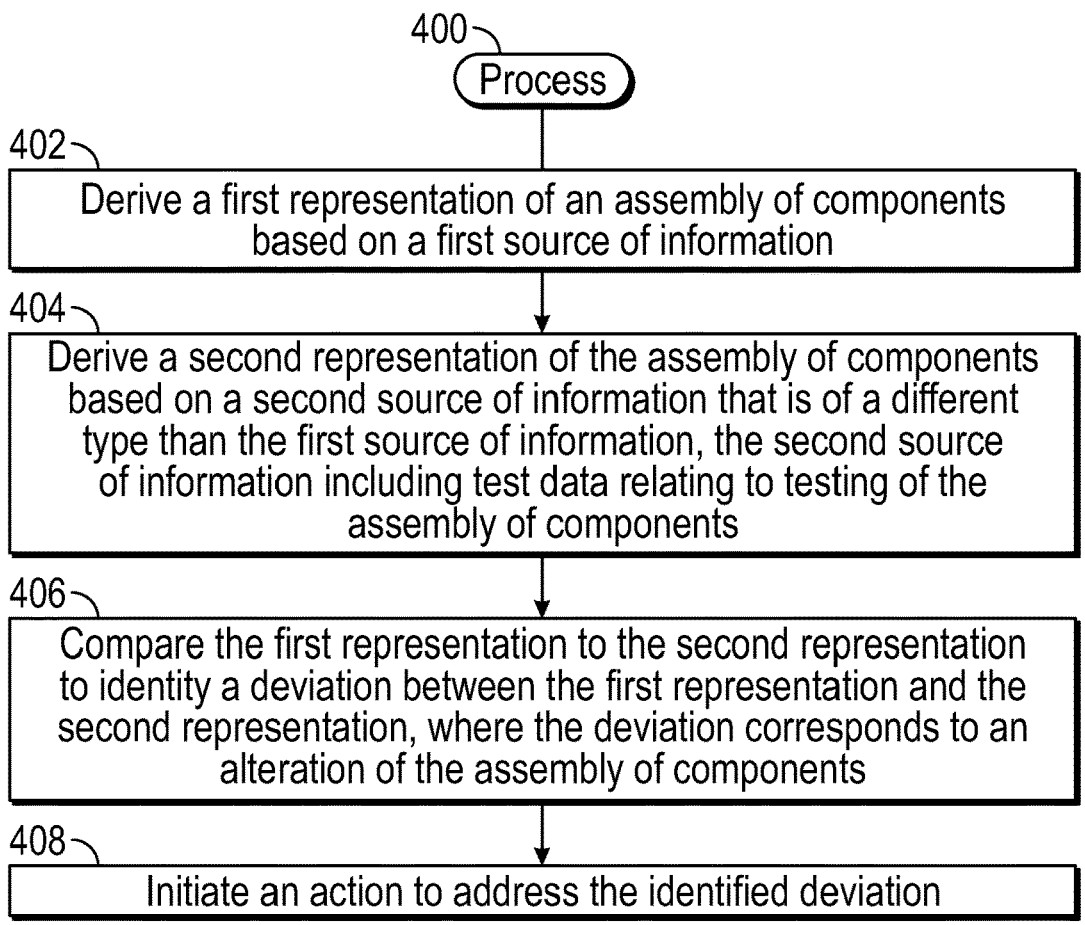
FIG. 4 is a flow diagram of a process according to some examples.

FIG. 4 is a flow diagram of a process 400 according to some examples. The process 400 includes deriving (at 402) (such as by a system including a hardware processor), a first representation of an assembly of components based on a first source of information. For example, the first representation can include an image representation.

The process 400 includes deriving (at 404) (such as by the system) a second representation of the assembly of components based on a second source of information that is of a different type than the first source of information, the second source of information including test data relating to testing of the assembly of components. In some examples, the test data indicates a presence or absence of a given component, and the first representation includes information inconsistent with the indication of the test data.

The process 400 includes comparing (at 406) (such as by the system) the first representation to the second representation to identify a deviation between the first representation and the second representation, where the deviation corresponds to an alteration of the assembly of components.

The process 400 includes initiating (at 408) (such as by the system) an action to address the identified deviation.

Figure 5:
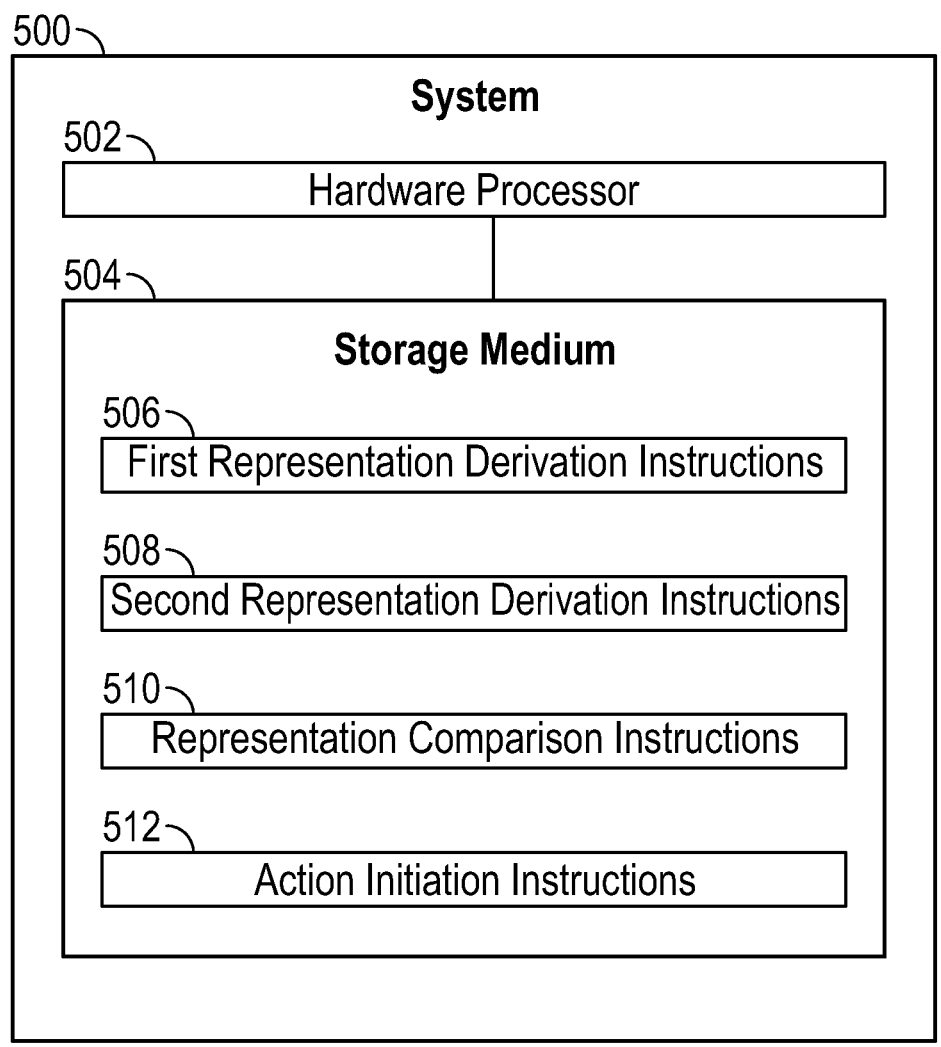
FIG. 5 is a block diagram of a system according to some examples.

FIG. 5 is a block diagram of a system 500 that includes a hardware processor 502 (or multiple hardware processors). A hardware processor can include a microprocessor, a core of a multi-core microprocessor, a microcontroller, a programmable integrated circuit, a programmable gate array, or another hardware processing circuit.

The system 500 includes a storage medium 404 storing machine-readable instructions executable on the hardware processor 502 to perform various tasks. Machine-readable instructions executable on a hardware processor can refer to the instructions executable on a single hardware processor or the instructions executable on multiple hardware processors.

The machine-readable instructions in the storage medium 504 include first representation derivation instructions 506 to derive a first representation of an assembly of components based on a first source of information, the first source of information including a collection of images of the assembly of components, and the collection of images including a marking on a given component of the assembly of components.

The machine-readable instructions in the storage medium 504 include second representation derivation instructions 508 to derive a second representation of the assembly of components based on a second source of information that is of a different type than the first source of information, the second representation including an indication of a source of the given component of the assembly of components.

The machine-readable instructions in the storage medium 504 include representation comparison instructions 510 to compare the first representation to the second representation to identify a deviation between the marking and the indication, the deviation corresponding to an alteration of the assembly of components.

The machine-readable instructions in the storage medium 504 include action initiation instructions 512 to initiate an action to address the identified deviation.

A storage medium (e.g., 500 in FIG. 3 or 504 in FIG. 5) can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A non-transitory machine-readable storage medium comprising instructions that upon execution cause a system to:
   receive image data captured by one or more cameras of an assembly comprising components;
   derive, based on the image data, a first representation of the assembly, the first representation having a format different from an image format of the image data, and the first representation comprising geometric profiles of the components in the assembly, and geometric information comprising coordinates of the geometric profiles, wherein the geometric profiles represent different shapes of the components, the different shapes comprising a rectangle for a first component and a circle for a second component, and the geometric information for the geometric profile representing the circle for the second component comprising a radius of the circle and coordinates of a center of the circle;
   derive a second representation of the assembly based on layout information representing a layout of components, component placement information identifying where the components in the assembly are to be placed, and production information specifying whether an optional section of the assembly is populated with components according to a build to order production of the assembly, the second representation comprising placement location information and geometric profiles of the components in the assembly;
   compare the first representation to the second representation to identify a deviation between the first representation and the second representation, the deviation corresponding to an alteration of the assembly of components; and
   initiate an action to address the identified deviation.

2. The non-transitory machine-readable storage medium of claim 1, wherein the second representation is derived further based on schematic information that defines a schematic arrangement of the components in the assembly.

3. The non-transitory machine-readable storage medium of claim 1, wherein the second representation is derived further based on information identifying rework including an authorized modification of the components in the assembly.

4. The non-transitory machine-readable storage medium of claim 1, wherein the second representation is derived further based on drill information identifying where holes are drilled in a circuit board of the assembly.

5. The non-transitory machine-readable storage medium of claim 1, wherein the image data comprises stitched image data produced by stitching a plurality of image tiles captured by respective cameras of different portions of the assembly.

6. The non-transitory machine-readable storage medium of claim 1, wherein the first representation corresponds to a first stage of building the assembly, and the instructions upon execution cause the system to:
   derive a third representation that corresponds to a different second stage of building the assembly, wherein the third representation is based on further image data acquired by one or more cameras of the second stage; and
   compare the first representation and the third representation to identify a deviation between the first representation and the third representation.

7. The non-transitory machine-readable storage medium of claim 1, wherein the first representation and the second representation comprise different vector representations of the assembly.

8. The non-transitory machine-readable storage medium of claim 7, wherein the first representation comprises a plurality of vectors, wherein each vector of the plurality of vectors specifies a respective geometric profile of the geometric profiles, and geometric information of the respective geometric profile.

9. The non-transitory machine-readable storage medium of claim 1, wherein the first representation comprises a marking on a given component in the assembly, the marking provided in the image data and indicating a vendor of the given component, wherein the second representation includes identifiers of sources of the components in the assembly, the identifiers derived based on vendor information identifying vendors of the components in the assembly, and
   wherein the comparing comprises comparing the marking to the identifiers of the sources of the components included in the second representation.

10. The non-transitory machine-readable storage medium of claim 1, wherein the second representation is derived further based on test data relating to testing of the components in the assembly, and the second representation includes a quantity of a given type of component in the assembly determined based on the test data,
    wherein the comparing is further based on the quantity of the given type of component in the assembly determined based on the test data.

11. A method comprising:
    receiving, by a system comprising a hardware processor, image data captured by one or more cameras of an assembly comprising components;
    deriving, by the system based on the image data, a first representation of the assembly, the first representation having a format different from an image format of the image data, and the first representation comprising geometric profiles of the components in the assembly, and geometric information comprising coordinates of the geometric profiles, wherein the geometric profiles represent different shapes of the components, the different shapes comprising a rectangle for a first component and a circle for a second component, and the geometric information for the geometric profile representing the circle for the second component comprising a radius of the circle and coordinates of a center of the circle;

deriving, by the system, a second representation of the assembly based on layout information representing a layout of components, and component placement information identifying where the components in the assembly are to be placed, the second representation comprising placement location information and geometric profiles of the components in the assembly, wherein the first representation and the second representation comprise different vector representations of the assembly, and the first representation comprises a plurality of vectors, and wherein each vector of the plurality of vectors specifies a respective geometric profile of the geometric profiles in the first representation, and geometric information of the respective geometric profile;

comparing, by the system, the first representation to the second representation to identify a deviation between the first representation and the second representation, the deviation corresponding to an alteration of the assembly; and initiating, by the system, an action to address the identified deviation.

12. The method of claim 11, wherein the second representation is derived further based on test data indicating a presence or absence of a given component, and the first representation comprises information inconsistent with the indicating of the presence or absence of the given component by the test data, and wherein the test data relates to testing of the components in the assembly.

13. The method of claim 11, wherein the second representation is derived further based on schematic information that defines a schematic arrangement of the components in the assembly.

14. The method of claim 11, wherein the second representation is derived further based on information identifying rework including an authorized modification of the components in the assembly.

15. The method of claim 11, wherein the second representation is derived further based on drill information identifying where holes are drilled in a circuit board of the assembly.

16. The method of claim 11, wherein the image data comprises stitched image data produced by stitching a plurality of image tiles captured by respective cameras of different portions of the assembly.

17. The method of claim 11, wherein the second representation is derived further based on production information specifying whether an optional section of the assembly is populated with components according to a build to order production of the assembly.

18. A system comprising:
a hardware processor; and
a non-transitory storage medium storing instructions executable on the hardware processor to:
receive image data captured by one or more cameras of a circuit board comprising components;
derive, based on the image data, a first representation of the circuit board, the first representation having a format different from an image format of the image data, and the first representation comprising geometric profiles of the components on the circuit board, and geometric information comprising coordinates of the geometric profiles, wherein the geometric profiles represent different shapes of the components, the different shapes comprising a rectangle for a first component and a circle for a second component, and the geometric information for the geometric profile representing the circle for the second component comprising a radius of the circle and coordinates of a center of the circle;
derive a second representation of the circuit board based on layout information representing a layout of the components on the circuit board, and component placement information identifying where the components on the circuit board are to be placed, the second representation comprising placement location information and geometric profiles of the components on the circuit board, wherein the first representation and the second representation comprise different vector representations of the circuit board, and the first representation comprises a plurality of vectors, and wherein each vector of the plurality of vectors specifies a respective geometric profile of the geometric profiles in the first representation, and geometric information of the respective geometric profile;
compare the first representation to the second representation to identify a deviation between the first representation and the second representation, the deviation corresponding to an alteration of the circuit board; and
initiate an action to address the identified deviation.

19. The system of claim 18, wherein the second representation is derived further based on schematic information that defines a schematic arrangement of the components on the circuit board, and drill information identifying where holes are drilled in the circuit board.

20. The system of claim 18, wherein the second representation is derived further based on production information specifying whether an optional section of the circuit board is populated with components according to a build to order production of the circuit board.

* * * * *